(12) United States Patent
Truhitte et al.

(10) Patent No.: US 10,103,072 B2
(45) Date of Patent: Oct. 16, 2018

(54) DAMAGING COMPONENTS WITH DEFECTIVE ELECTRICAL COUPLINGS

(71) Applicant: SEMICONDUCTOR COMPONENTS INDUSTRIES, LLC, Phoenix, AZ (US)

(72) Inventors: Darrell D. Truhitte, Phoenix, AZ (US); James P. Letterman, Jr., Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/240,835

(22) Filed: Aug. 18, 2016

(65) Prior Publication Data

US 2018/0053696 A1    Feb. 22, 2018

(51) Int. Cl.
*H01L 21/66* (2006.01)
*H01L 21/268* (2006.01)
*H01L 23/00* (2006.01)

(52) U.S. Cl.
CPC .......... *H01L 22/22* (2013.01); *H01L 21/268* (2013.01); *H01L 24/35* (2013.01); *H01L 24/43* (2013.01); *H01L 2224/35848* (2013.01); *H01L 2224/43848* (2013.01); *H01L 2224/48091* (2013.01); *H01L 2224/48247* (2013.01); *H01L 2924/1203* (2013.01); *H01L 2924/1304* (2013.01)

(58) Field of Classification Search
CPC ....... H01L 22/22; H01L 21/268; H01L 24/43; H01L 24/35; H01L 2224/48247; H01L 2224/35848; H01L 2924/1304; H01L 2924/1203; H01L 2224/48091; H01L 2224/43848
USPC .......................................... 438/15
See application file for complete search history.

(56) References Cited

U.S. PATENT DOCUMENTS

| | | | | |
|---|---|---|---|---|
| 5,713,563 | A * | 2/1998 | Chan | B25B 11/005 269/27 |
| 6,240,633 | B1 * | 6/2001 | Kent | H05K 13/08 29/707 |
| 6,566,654 | B1 * | 5/2003 | Funatsu | H01J 37/28 250/306 |
| 6,710,371 | B2 * | 3/2004 | Kitahara | H01L 27/0207 257/204 |
| 7,234,232 | B2 * | 6/2007 | Yeh | H01L 21/485 257/E21.526 |
| 7,733,435 | B2 * | 6/2010 | Hirakata | G02F 1/136259 349/192 |
| 8,125,070 | B2 * | 2/2012 | Kredler | H01L 22/34 257/690 |
| 8,283,661 | B2 * | 10/2012 | Miyazawa | H01L 51/56 257/40 |
| 8,461,673 | B2 * | 6/2013 | Haba | H01L 21/78 257/686 |
| 2011/0155705 | A1 * | 6/2011 | Lim | B23K 26/38 219/121.72 |

(Continued)

*Primary Examiner* — Vu A Vu
(74) *Attorney, Agent, or Firm* — IPTechLaw

(57) ABSTRACT

A method, in some embodiments, comprises: providing a component having first and second electrical nodes; determining that the component lacks multiple, functional electrical couplings between said first and second nodes; damaging at least part of the component as a result of said determination; and determining, as a result of said damage, that the component is defective.

17 Claims, 5 Drawing Sheets

(56) References Cited

U.S. PATENT DOCUMENTS

| | | | |
|---|---|---|---|
| 2012/0268849 A1* | 10/2012 | Tomatsu | H01L 27/0266 361/56 |
| 2014/0070389 A1* | 3/2014 | Kaneda | H01L 24/09 257/676 |
| 2014/0313450 A1* | 10/2014 | Kato | H01L 27/124 349/46 |
| 2015/0229102 A1* | 8/2015 | Khan | H01S 5/0261 372/38.04 |

* cited by examiner

DAMAGING COMPONENTS WITH DEFECTIVE ELECTRICAL COUPLINGS

BACKGROUND

Semiconductor components, such as packages that contain integrated circuits or discrete devices, perform one or more functions in the context of a larger electronic system within which they are deployed. Often, such components will contain multiple electrical couplings between a pair of nodes. For example, a package may contain multiple wire bonds coupling a pin (e.g., terminal or lead on the lead frame) to a common point (e.g., a bond pad) on a die. If the functional integrity of one or more of these electrical couplings is compromised, the package may not be able to perform properly. Identifying and removing compromised packages and other components from the assembly line, however, remains a challenge.

SUMMARY

At least some of the embodiments disclosed herein are directed to a method, comprising: providing a component having first and second electrical nodes; determining that the component lacks multiple, functional electrical couplings between said first and second nodes; damaging at least part of the component as a result of said determination; and determining, as a result of said damage, that the component is defective. One or more of these embodiments may be supplemented using one or more of the following concepts, in any order and in any combination: wherein said damaging comprises using a laser to short one or more electrical connections in the component; wherein said damaging comprises using a laser to open one or more electrical connections in the component; wherein using the laser to open the one or more electrical connections comprises opening an electrical coupling between the first and second nodes; wherein said electrical coupling between the first and second nodes is selected from the group consisting of: wire bonds, clip bonds and ribbon bonds; wherein said damaging comprises dispensing an electrically conductive material to short one or more electrical connections in the component; wherein said damaging comprises electrically coupling a top surface of a die to a bottom surface of the die; wherein said damaging comprises electrically coupling a top or bottom surface of a die to a side surface of the die; wherein said damaging comprises using an electrostatic discharge; further comprising performing said damage using a wire bonding machine; wherein determining that the component is defective comprises determining that the component is defective during an electrical test.

At least some embodiments are directed to a method, comprising: providing a component having multiple electrical nodes; identifying a defect in an electrical coupling scheme between said multiple nodes; and introducing electrical damage to the component upon identifying said defect. One or more of these embodiments may be supplemented using one or more of the following concepts, in any order and in any combination: wherein said component is selected from the group consisting of: an integrated circuit package, a discrete device package, a multi-die device, a multi-chip module, a system in package, and a passive device; wherein said component comprises a diode or a transistor; wherein said multiple nodes include a component terminal and the surface of a die; wherein said electrical coupling scheme includes one or more electrical couplings between the multiple nodes; wherein introducing said electrical damage comprises applying laser light to the component or dispensing electrically conductive material into the component; wherein introducing said electrical damage comprises electrically coupling two separate surfaces of a die in said component; wherein introducing said electrical damage comprises introducing an electrical parametric defect to said component; further comprising performing an electrical test after introducing said electrical damage; determining, as a result of said electrical test, that said component is defective; and as a result of said determination, removing said component from an assembly line.

Figure 1:
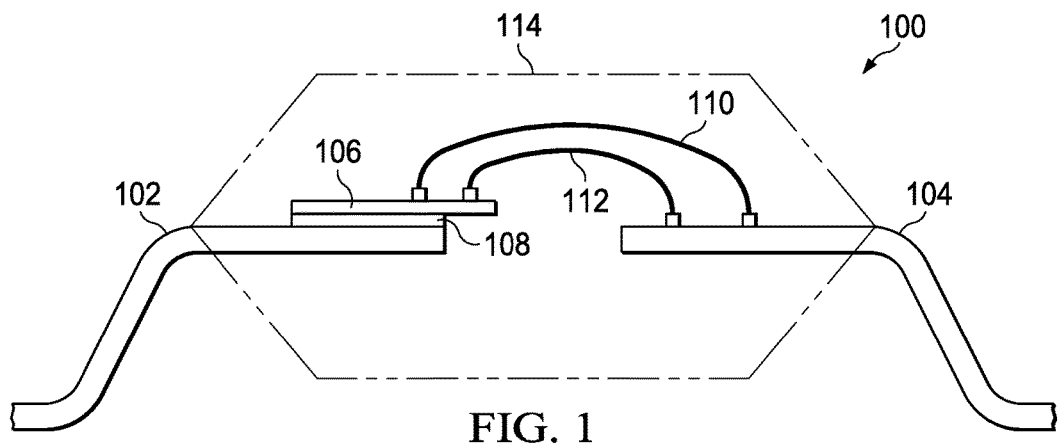
FIG. 1 is a side view of a discrete device package.

It should be understood that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Disclosed herein are techniques for identifying and intentionally damaging semiconductor components that carry a risk of failure or improper operation due to defects, such as defective or missing electrical couplings between common nodes within the components. (The term "component," as used herein, includes—without limitation—completed semiconductor packages, multi-die devices, multi-chip modules, systems in packages, passive devices, and any such packages, devices, and/or modules that are in the assembly process.) The techniques described herein may more broadly be applied to any component that is defective in any way. Defective components—such as those that have missing or defective electrical couplings between a pair of nodes within the component—are identified using a suitable detection system, such as a wire bond detection system or a vision system. Damage is subsequently inflicted on the defective components using any suitable technique—for instance, by creating electrical shorts or opens using, e.g., lasers, electrically conductive material, electrostatic discharges or hydrogen flames. This damage causes the defective components to malfunction during electrical tests at the end of the manufacturing process, and, consequently, the damaged components are removed from the assembly line. The following figures and description frequently refer to packages—and, more particularly, to discrete device packages—but the various techniques described herein may be applied to any and all types of components, and the following figures and description should not be construed as a limitation on the scope of the disclosure.

Figure 2:
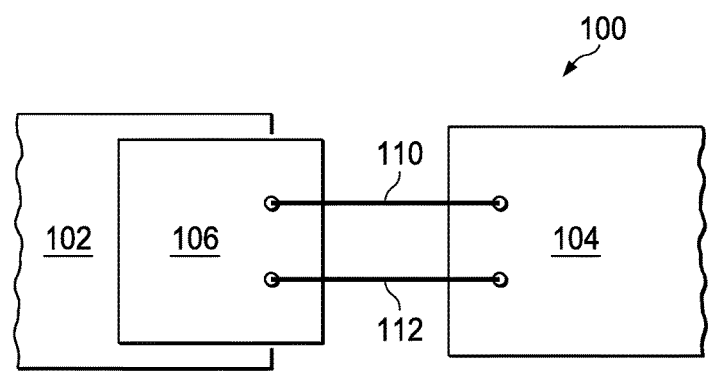
FIG. 2 is a top-down view of a discrete device package.

FIG. 1 is a side view of a discrete device package 100 that includes multiple leads 102, 104. A die 106 is mounted on the lead 102 using a suitable die bond material 108 (e.g., a conductive material, such as solder or an epoxy). The bottom surface of the die 106 electrically couples to the lead 102 via the die bond material 108. The top surface of the die 106 electrically couples to the lead 104 via electrical couplings (e.g., wire bonds, clip bonds, ribbon bonds) 110, 112. The top and bottom surfaces of the die 106 are electrically isolated from each other. The package 100 additionally includes a mold 114. In this configuration, the die 106 may function as a discrete device such as a diode or a transistor, although the scope of disclosure is not limited to any particular type of component or configuration of leads, die and electrical couplings. To function properly, the package 100 requires that multiple, functional electrical couplings connect the top surface of the die 106 to the lead 104. (The term "functional electrical couplings," as used herein, means electrical couplings that form electrical pathways in the manner required for proper operation of the package.) The electrical couplings 110, 112 fulfill this requirement, as they maintain structural integrity and are properly coupled to the die 106 and the lead 104. FIG. 2 is an illustrative, top-down view of the discrete device package 100 of FIG. 1. As in FIG. 1, the package 100 shown in FIG. 2 has multiple, functional electrical couplings 110, 112 that enable the package to operate as intended. The electrical couplings connect the top surface of the die 106 to the lead 104. The scope of disclosure is not limited to packages or other components that require multiple, functional electrical couplings between die and leads. Rather, the disclosure encompasses components requiring multiple, functional electrical couplings between any set of nodes (i.e., two or more nodes) within the component—for instance, between a die and another die, between two leads or terminals, and the like.

Figure 3A:
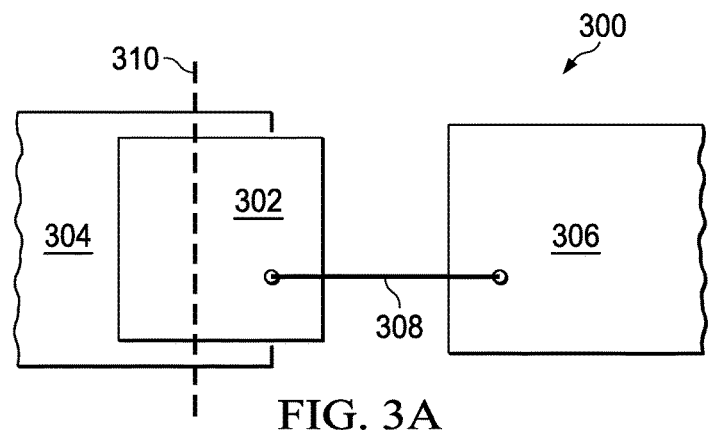
FIGS. 3A-5 are top-down views and/or side views of discrete device packages being damaged using a laser.

Not all such components, however, have the required number of functional, properly-connected electrical couplings. For example, in some cases one or more of the required electrical couplings may be omitted or one or more of the electrical couplings may be damaged or defective in some way. FIG. 3A is an illustrative, top-down view of a package 300 missing an electrical coupling that is required for the package to operate properly. Specifically, the package 300 includes a die 302 coupled to a lead 304 via an electrically conductive die bond (e.g., a conductive epoxy; not expressly shown), and it further couples to a lead 306 using only one electrical coupling (e.g., wire bond, clip bond, ribbon bond) 308. However, it is missing an additional electrical coupling between the top surface of the die 302 and the lead 306. Thus, because the package 300 lacks the additional electrical coupling, the package 300 cannot operate as intended. Such a defective package may escape detection during an end-of-assembly electrical test, but it would likely fail during implementation in the field. The defective electrical coupling scheme can, however, be detected during assembly using a wire bond detection system and/or a vision system, both of which are known in the art.

After a component with a defective electrical coupling scheme (e.g., missing one or more required functional, electrical couplings between two or more nodes) is detected, the component is physically damaged by any suitable technique—for instance, by introducing an electrical short, an electrical open, or both. Accordingly, FIG. 3A depicts a laser cut 310 that introduces an electrical short to a package. The laser cut 310 is made using any suitable laser source, such as an ALLTEC® or ROFIN® laser, with an illustrative wavelength of 1.064 micrometers. The laser cut 310 is applied across the die 302, cutting through the entire thickness of the die. (Alternatively, the laser cuts through just the active surface of the die 302.) The heat generated by the laser causes metallic traces on the die and/or semiconductor material within the die to melt and flow, thus forming an electrically conductive pathway between the top surface of the die 302, the die bond, the lead 304 and the bottom surface of the die 302. This electrically conductive pathway forms an electrical short, thus damaging the die 302 and rendering it functionally unacceptable and/or altogether inoperable.

Figure 3B:
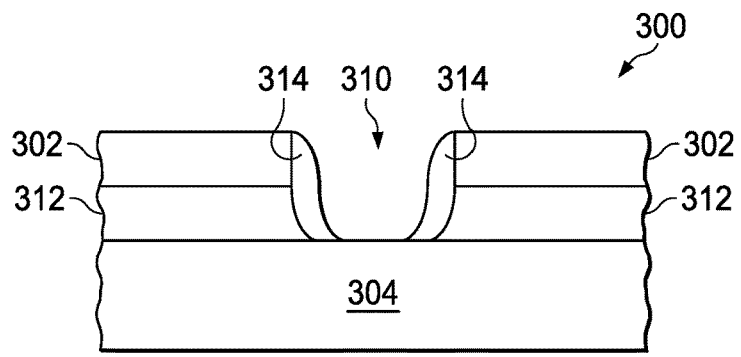

FIG. 3B is a partial, magnified side view of the package 300 after the laser cuts through the full thickness of the die 302. As shown, the heat from the laser cut 310 results in a melting and flow of electrically conductive materials, including the die 302, metallic components on the die, and the die bond material 312. This melt-and-flow process forms electrically conductive pathways 314 between the top surface of the die 302 and the lead 304, which, in turn, is already electrically connected to the bottom surface of the die 302. Additionally, the top surface of the die 302 couples to the die bond material 312. In this way, an electrical short has been formed. This electrical short will be recognized as a defect during electrical testing, and the package will be picked from the assembly line and discarded. Laser cuts such as that depicted in FIG. 3A are not limited to any particular shape, size, depth or pattern. Any and all types of damage that can be inflicted by a laser are contemplated and included within the scope of this disclosure.

Figure 4:
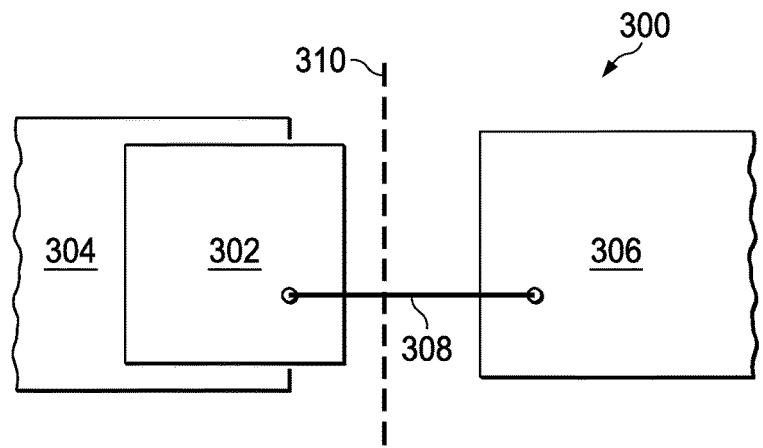
Figure 5:
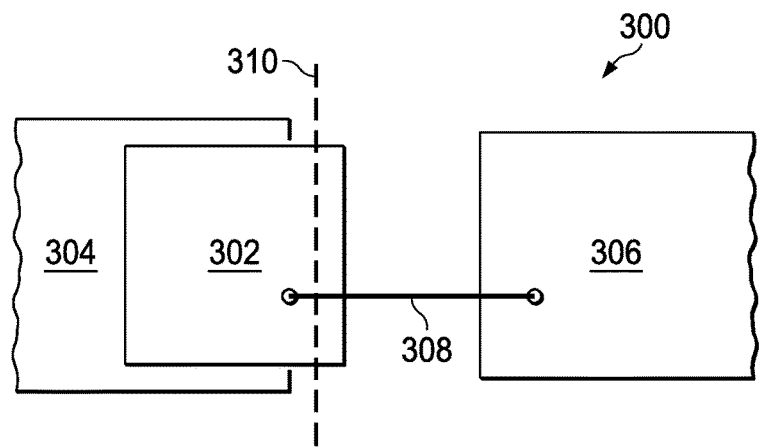

FIGS. 4 and 5 show alternate locations at which the laser cut 310 may be made. Specifically, FIG. 4 shows a laser cut 310 applied on the electrical coupling 308. This laser cut severs the electrical coupling 308, leaving no electrical connection between the die 302 and the lead 306 (i.e., an electrical open). While a single electrical coupling between the die 302 and the lead 306 may not be detected as a defect during electrical testing, the absence of any electrical coupling between the die 302 and the lead 306 will be detected as a defect. Accordingly, the package will be removed from the assembly process. FIG. 5 shows a laser cut 310 applied on both the die 302 (which can be a cut through the full thickness of the die or just through the top, active surface of the die) and the electrical coupling 308. This results in a severed electrical coupling 308 (i.e., an electrical open), as described with respect to FIG. 4. In addition, in the event of a cut through the full thickness of the die, it may result in a melt-and-flow process between the multiple surfaces of the die 302, the die bond material under the die 302, and the lead 304 (i.e., an electrical short), as described with respect to FIGS. 3A and 3B. For example, electrically conductive material molten by the laser cut may flow from the top surface of the die 302 to one or more sides of the die 302, to the bottom surface of the die 302, to the die bond, and/or to one or more surfaces of the lead 304. As explained, such defects will be detected during end-of-assembly electrical testing and will cause the package to be removed from the assembly process.

Figure 6:
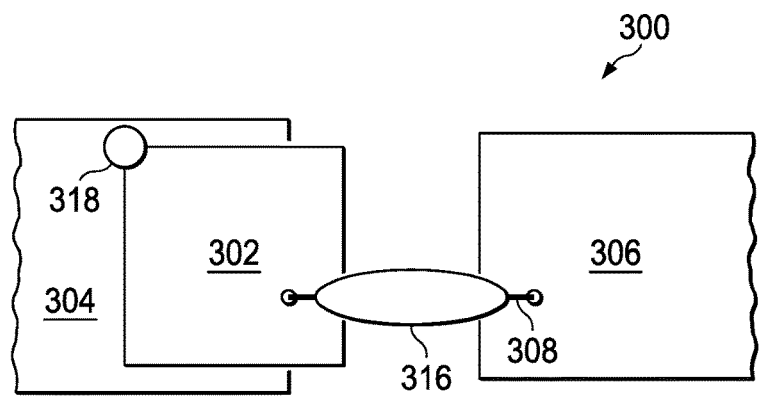
FIGS. 6-8 are top-down views of discrete device packages being damaged by dispensing electrically conductive material.
Figure 7:
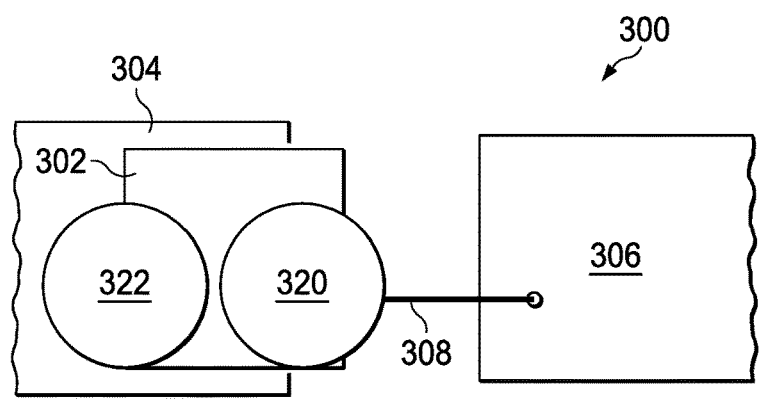
Figure 8:
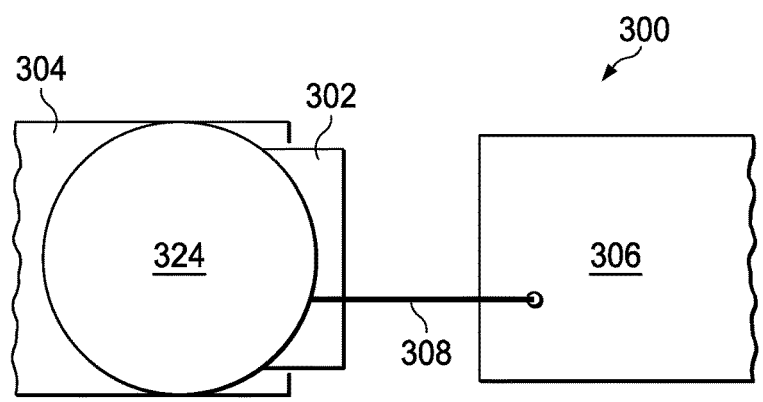

As previously explained, techniques other than laser cutting may be used to inflict damage on defective components. FIGS. 6-8 depict top-down views of a package 300 that is defective due to an insufficient number of functional electrical couplings between the top surface of the die 302 and the lead 306 and that has been electrically shorted by the dispensation of electrically conductive material as a result. Such electrically conductive material may include any fluid (i.e., capable of flowing, regardless of viscosity) metals or alloys—for instance, solder—that may be dispensed in any desired quantity or form to introduce one or more electrical shorts into the package 300. FIG. 6, for instance, depicts electrically conductive material 316 that has been dispensed over the electrical coupling 308 and over at least a portion of the top surface of the die 302. This molten, electrically conductive material 316 flows so that it electrically connects the top surface of the die 302, the electrical coupling 308, the lead 306, a side of the die 302, the bottom surface of the die 302, the die bond, and/or one or more surfaces of the lead 302. FIG. 6 additionally depicts electrically conductive material 318 that has been dispensed over a corner of the top surface of the die 302. This molten, conductive material flows downward, thereby electrically coupling the top surface of the die 302, one or more sides of the die 302, the die bond, and/or one or more surfaces of the lead 304. All such electrical connections introduce electrical shorts that will be detected during subsequent electrical testing.

FIG. 7 depicts electrically conductive material 320 that has been dispensed over the top surface of the die 302 and over a portion of the electrical coupling 308. The flow of the material 320 results in electrical connections between the electrical coupling 308, the lead 306, the top surface of the die 302, one or more sides of the die 302, a bottom surface of the die 302, the die bond, and/or the lead 304. Electrically conductive material 322 may be dispensed in addition to or in lieu of the electrically conductive material 320. FIG. 8 depicts electrically conductive material 324 that has been dispensed over the top surface of the die 302. The flow of the material 320 results in electrical connections between the electrical coupling 308, the lead 306, the top surface of the die 302, one or more sides of the die 302, a bottom surface of the die 302, the die bond, and/or the lead 304. The dispensations depicted in FIGS. 6-8 are merely illustrative. The scope of disclosure includes dispensations of electrically conductive material of any size, shape and location.

Damage infliction—whether by laser cuts, electrically conductive material, or other techniques or materials—may be performed in any suitable stage of the assembly process. In some embodiments, a laser source may be coupled to a wire bonding machine (e.g., in proximity to the bond head area). For example, the laser source may be bolted onto a wire bonder to form a linked laser system, and a stage may be provided on an output of the wire bonder to inflict damage on a component if the wire bond detection system determines that the component is defective. Similarly, in some embodiments, a dispenser of electrically conductive material may be provided as a bolt-on module for the wire bonding machine. In some embodiments, a standalone machine separate from the wire bonding machine may be used to inflict damage, whether in the form of laser cuts, the application of electrically conductive material, or another suitable technique. In some embodiments, a vision system that incorporates an add-on module for inflicting damage may be used. In such embodiments, when the vision system detects a defect in the component, the add-on module uses laser cuts, electrically conductive material, or any other suitable technique(s) or material(s) to inflict damage on the defective component. In general, damage may be inflicted at any time prior to encapsulation or enclosure of the component.

The scope of disclosure is not limited to intentionally damaging just the portion(s) of a component that have electrical coupling defects. Instead, a component that is defective in any way may be damaged in any way so that the component fails a subsequent electrical test in any way. In some embodiments, rather than damaging a die that has a faulty connection with a single lead, multiple wire bonds coupling the die to another lead may be severed so that the overall component still fails the electrical test. In some embodiments, electrically conductive material may be deposited between two or more leads, between two or more electrical couplings, or some combination thereof to achieve an electrical short that would fail a subsequent electrical test.

The scope of disclosure is not limited to inflicting damage using lasers or electrically conductive material. As previously explained, any technique or material may be used to inflict damage on a defective component, as long as that technique or material inflicts sufficient damage so that the component fails an electrical test during the assembly process. Thus, for instance, an electrostatic discharge (e.g., an electronic flame off (EFO)) may be used to inflict damage on electrical couplings, such as wire bonds. In some embodiments, a hydrogen flame may be used to melt electrical couplings. In addition, the scope of disclosure is not limited to applying any disclosed or contemplated materials in any particular manner. Thus, for example, the aforementioned electrically conductive material may be printed instead of dispensed. In some embodiments, a two-step damaging process may be used in which the top, non-conductive layer of a die is first removed and then an electrically conductive material is applied to create an electrical short. In some embodiments, electrical parametric defects may be introduced into the component such that the component fails the subsequent electrical test. In such embodiments, any suitable technique may be used to shift one or more electrical parameters outside of the specification range. Care should be exercised to shift electrical parameters that are actually tested. For instance, a functional device within a component may be replaced with a non-functional device, or high levels of heat may be applied to cause catastrophic degradation of one or more devices within a component. Any and all such techniques and materials are contemplated and included within the scope of this disclosure.

Figure 9:
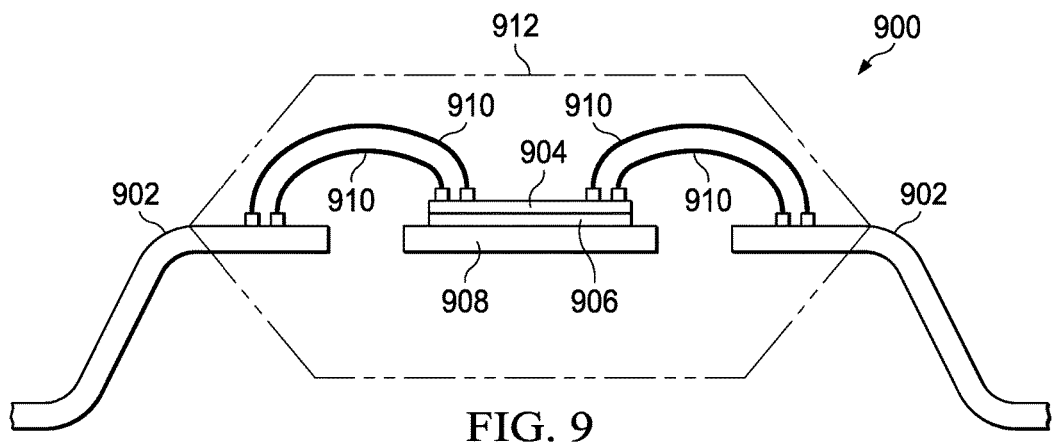
FIG. 9 is a side view of an integrated circuit package.
Figure 10:
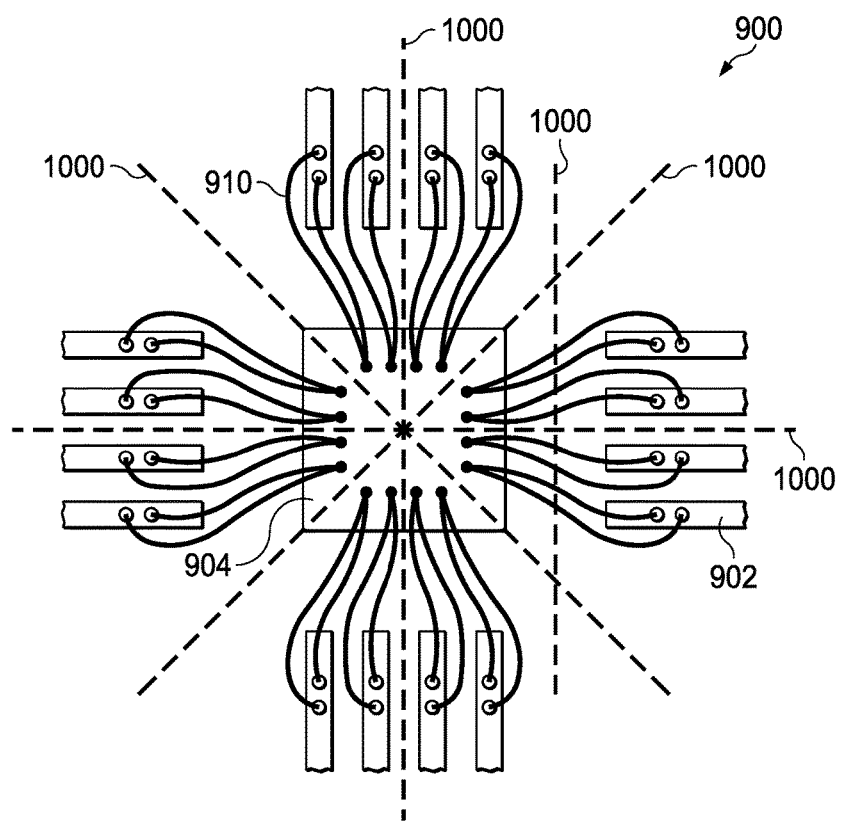
FIG. 10 is a top-down view of an integrated circuit package being damaged using a laser.
Figure 11:
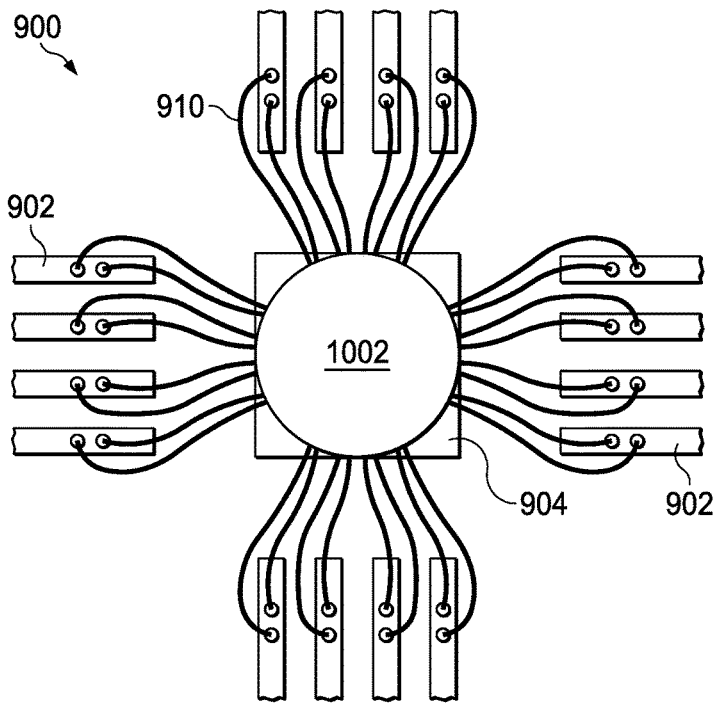
FIG. 11 is a top-down view of an integrated circuit package being damaged by dispensing electrically conductive material.

FIG. 9 is a side view of an integrated circuit package 900. The package 900 includes leads 902, a die 904, a die bond 906, a die flag 908, electrical couplings 910, and a mold 912. To function properly, the package 900 requires multiple, functional electrical couplings between the die 904 and each of the leads 902. If, during the assembly process, a wire bond detection system or a vision system detects a defect in one or more electrical couplings, or if it determines that the required electrical couplings are not present in the package 900, the package 900 is damaged using, e.g., laser cuts, electrically conductive material, EFO and/or hydrogen flames. FIG. 10 depicts a top-down view of the package 900 and shows various non-limiting laser cuts 1000 that could be inflicted on the package 900 to introduce one or more electrical shorts and/or electrical opens. Similarly, FIG. 11 depicts a top-down view of the package 900 and shows an illustrative electrically conductive material 1002 that could be dispensed on the package 900 to introduce one or more electrical shorts.

Figure 12:
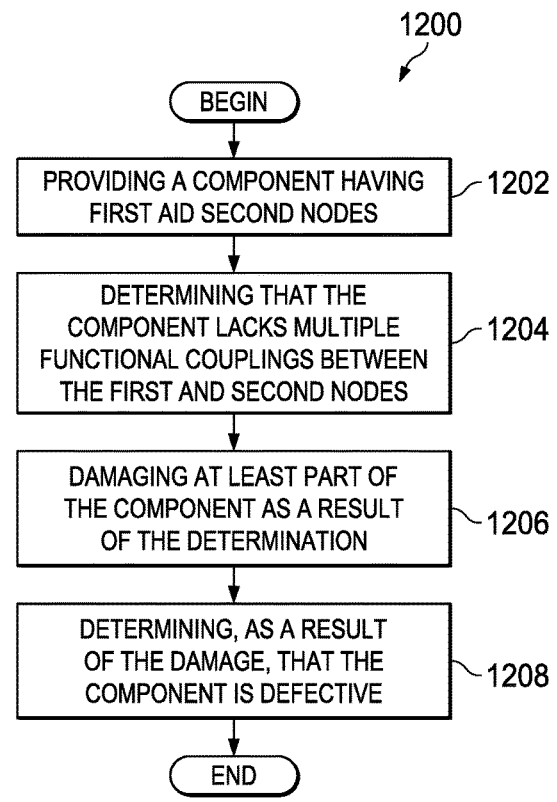
FIG. 12 is a flow diagram of a method for damaging components with defective or missing electrical couplings.

FIG. 12 is a flow diagram of a method 1200 for damaging components with defective or missing electrical couplings. The method 1200 begins by providing a component having first and second nodes requiring multiple, functional electrical couplings therebetween to operate properly (step 1202). As explained above, the component may be a completed semiconductor package, a multi-die device, a multi-chip module, a system in package, a passive device, and any such packages, devices, and/or modules that are in the assembly process. The component may contain any type and number of nodes (e.g., leads, pins, terminals, different die surfaces, multiple die), and may require any type and number of electrical couplings (e.g., wire bonds, ribbon bonds, clip bonds). The method 1200 continues by determining that the component lacks multiple, functional couplings between the first and second nodes (step 1204). This determination may be made using any suitable technique, such as a wire bond detection system or a vision system. Other techniques for identifying defective or insufficient electrical couplings between two or more nodes are contemplated and encompassed within the scope of this disclosure. The method 1200 subsequently comprises inflicting damage on at least part of the component as a result of the determination of step 1204 (step 1206). This damage may be inflicted in any number of ways, including the application of electrically conductive material, laser cuts, the application of heat using a technique other than laser, hydrogen flame, EFO, and the like. Other types of damage, such as mechanical damage inflicted by blunt force, are also contemplated. The method 1200 finally includes determining, as a result of the intentionally inflicted damage, that the component is defective (step 1208). This determination may be made, for instance, during an electrical test toward the end of the assembly process. If an intentionally-damaged component is identified as defective, it is removed from the assembly process and discarded or otherwise disposed. The steps of the method 1200 may be modified as desired, including by adding, removing, modifying or rearranging one or more steps.

Numerous other variations and modifications will become apparent to those skilled in the art once the above disclosure is fully appreciated. It is intended that the following claims be interpreted to embrace all such variations, modifications and equivalents. In addition, the term "or" should be interpreted in an inclusive sense.

What is claimed is:

1. A method, comprising:
   providing a component having first and second electrical nodes;
   determining that the component lacks multiple, functional electrical couplings between said first and second nodes;
   damaging at least part of the component by shorting said first node to said second node as a result of said determination; and
   determining, as a result of said damage, that the component is defective.

2. The method of claim 1, wherein said damaging comprises using a laser to short one or more electrical connections in the component.

3. A method, comprising:
   providing a component having first and second electrical nodes;
   determining that the component lacks multiple, functional electrical couplings between said first and second nodes;
   damaging at least part of the component as a result of said determination using a laser to open one or more electrical connections in the component; and
   determining, as a result of said damage, that the component is defective.

4. The method of claim 3, wherein using the laser to open the one or more electrical connections comprises opening an electrical coupling between the first and second nodes.

5. The method of claim 4, wherein said electrical coupling between the first and second nodes is selected from the group consisting of: wire bonds, clip bonds and ribbon bonds.

6. The method of claim 1, wherein said damaging comprises dispensing an electrically conductive material to short one or more electrical connections in the component.

7. The method of claim 1, wherein said damaging comprises electrically coupling a top surface of a die to a bottom surface of the die.

8. The method of claim 1, wherein said damaging comprises electrically coupling a top or bottom surface of a die to a side surface of the die.

9. A method, comprising:
   providing a component having first and second electrical nodes;
   determining that the component lacks multiple, functional electrical couplings between said first and second nodes;
   damaging at least part of the component as a result of said determination using an electrostatic discharge; and
   determining, as a result of said damage, that the component is defective.

10. The method of claim 1, further comprising performing said damage using a wire bonding machine.

11. The method of claim 1, wherein determining that the component is defective comprises determining that the component is defective during an electrical test.

12. A method, comprising:
   providing a component having multiple electrical nodes;
   identifying a defect in an electrical coupling scheme between said multiple nodes; and
   introducing electrical damage to the component upon identifying said defect to impair function of the component by shorting at least two of said multiple nodes together,
   wherein introducing said electrical damage comprises at least one of applying laser light to the component or dispensing electrically conductive material into the component or electrically coupling two separate surfaces of a die in said component.

13. The method of claim 12, wherein said component is selected from the group consisting of: an integrated circuit package, a discrete device package, a multi-die device, a multi-chip module, a system in package, and a passive device.

14. The method of claim 12, wherein said component comprises a diode or a transistor.

15. The method of claim 12, wherein said multiple nodes include a component terminal and a surface of a die.

16. The method of claim 12, wherein said electrical coupling scheme includes one or more electrical couplings between the multiple nodes.

17. The method of claim 12, further comprising:
   performing an electrical test after introducing said electrical damage; and
   determining, as a result of said electrical test, that said component is defective.

* * * * *